United States Patent [19]

Kai

[11] Patent Number: 4,852,066
[45] Date of Patent: Jul. 25, 1989

[54] SEMICONDUCTOR MEMORY DEVICE

[75] Inventor: Naoyuki Kai, Tokyo, Japan

[73] Assignee: Kabushiki Kaisha Toshiba, Kawasaki, Japan

[21] Appl. No.: 146,700

[22] Filed: Jan. 21, 1988

[30] Foreign Application Priority Data

Feb. 17, 1987 [JP] Japan .................................. 62/32503

[51] Int. Cl.$^4$ .......................... G11C 11/40; G11C 13/00
[52] U.S. Cl. ................... 365/230.03; 365/182; 365/230.06
[58] Field of Search ............... 365/182, 189, 195, 230, 365/190, 201

[56] References Cited

U.S. PATENT DOCUMENTS 4,763,304 8/1988 Uesugi .................................. 365/230

OTHER PUBLICATIONS

Ochii et al., "A 17ns 64K CMOS RAM with a Schmitt Trigger Sense Amplifier," ISSCC Digest of Technical Papers, pp. 64-65, Feb. 13, 1985.
Saito et al., "A 1Mb CMOS DRAM with Fast Page and Static Column Modes," ISSCC Digest of Technical Papers, pp. 252-253, Feb. 15, 1985.

*Primary Examiner*—Terrell W. Fears
*Attorney, Agent, or Firm*—Finnegan, Henderson, Farabow, Garrett & Dunner

[57] ABSTRACT

A semiconductor memory device includes a column decoder which is constructed such that it selects two adjacent columns in a memory cell array, and by means of which one of the two columns at a higher or lower position is selected, depending on whether or not a control signal indicates that one is added to a designated address. When the designated column address is the most significant address, the most and least significant addresses are selected, and if, in this case, the control signal indicates that one is added to the designated address, the least significant column address is selected and an address carry signal is generated. If, on the other hand, the control signal indicates that one is not added to the designated address, then the most significant column address is selected, in which case no address carry signal is generated. Similarly, a row decoder is constructed such that it selects two adjacent rows in the memory cell array, and one of the two columns at a higher or lower position is respectively selected, depending on whether or not an address carry signal is generated from the column decoder. When the designated row address is the most significant address, the most and least significant addresses are selected, and if, in this case, the address carry signal is generated from the column decoder, the least significant row address is selected, while if the address carry signal is not generated, then the most significant row address is selected.

15 Claims, 4 Drawing Sheets

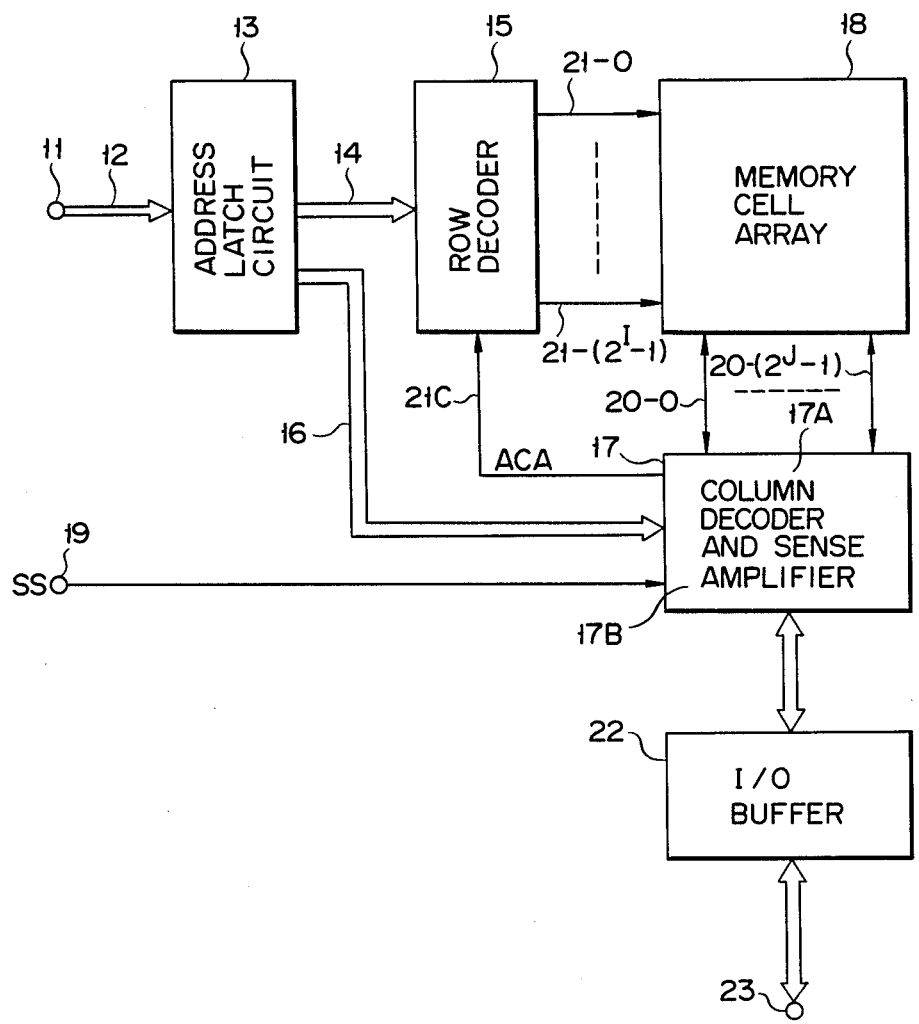
F I G. 1

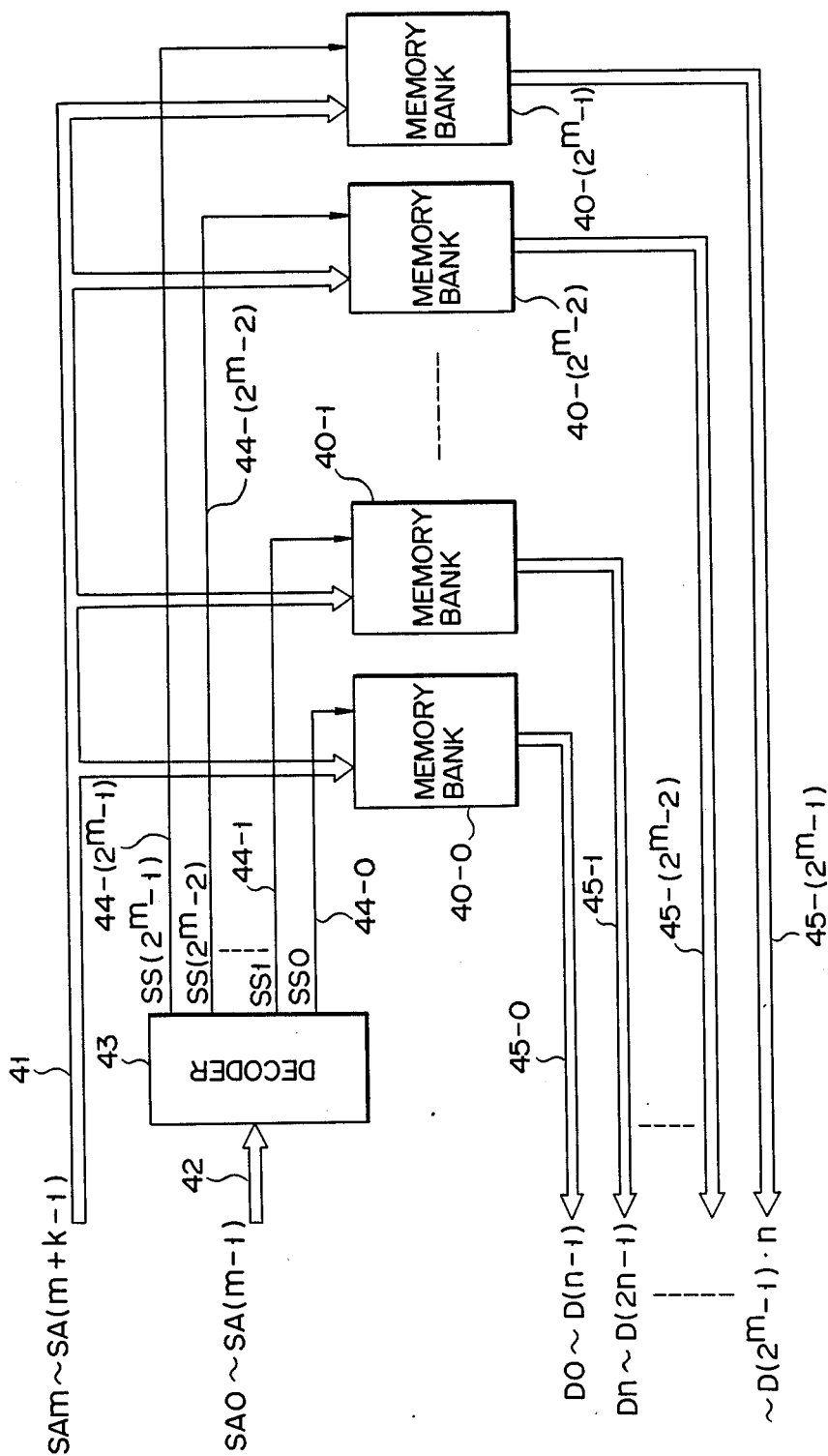
F I G. 4

SEMICONDUCTOR MEMORY DEVICE

BACKGROUND OF THE INVENTION

This invention relates to a semiconductor memory device in which memory cells can be accessed by an address supplied to an address bus and an address obtained by adding "1" to the supplied address.

Generally, a row of memory cells in a memory cell array of a semiconductor memory device is selected by a row address signal, with one cell from among the selected row being selected by a column address signal. In other words, a given memory cell is selected by row and column address signals and is then accessed.

In a computer system employing such a semiconductor memory device as described above, a specific memory system may be used. In such a memory system, the same address is assigned to a preset number of memory bits (n-bits) as one unit, and a unit of processing amount (which is called a word) handled by a CPU may be constituted by $2^m \times n$ bits. In this case, the memory system is constituted by $2^m$ memory banks which are each constituted by an n-bit memory. Each of the $2^m$ memory banks is supplied with common row and column address signals, thereby permitting data to be read out from corresponding memory cells of the respective memory banks.

With this construction, a word starting at an address of an integer multiple of $2^m$ can be accessed during each operation of accessing the memory system. However, this being the case, it is then impossible to access to a word starting at a desired address. In order to be able to access a word starting at a desired address, it then becomes necessary to use a plurality of address incrementers, for incrementing by one the address supplied to the memory bank, and an address selector for selecting output data from the address incrementer or normal address (an address not incremented). However, use of such address incrementers increases the length of time necessary to access the desired memory cell, since additional time is required for the address incrementer to increment the address by one.

SUMMARY OF THE INVENTION

An object of this invention is to provide a semiconductor memory device which can access a word starting at a given address, without incurring an increase in the access time.

The above object can be attained by means of a semiconductor memory device which comprises a memory cell array; a column decoder for selecting a memory cell column in the memory cell array, in response to a column address signal; a control signal input terminal connected to receive a control signal determining whether or not one has been added to the address designating the memory cell column selected by the column decoder; a first selection circuit for selecting, in response to the control signal, one of the column address designating the memory cell column selected by the column decoder, and a different address, obtained by adding one to the selected column address, or one of the most and least significant column addresses, when the column address is the most significant column address; an address carry signal generating circuit for generating an address carry signal when the most significant address is selected by the column decoder and the control signal is set to indicate that one is added to the selected column address; a row address decoder for selecting a memory cell row in the memory cell array, in response to a row address signal; and a second selection circuit for selecting, in response to an address carry signal from the address carry signal generating circuit, one of the row address designating the memory cell row selected by the row decoder, and a different address, obtained by adding one to the selected row address, or one of the most and least significant row addresses, when the row address is the most significant row address.

With this construction, each word starting at a given address can be accessed, without incurring an increase in the access time.

BRIEF DESCRIPTION OF THE DRAWINGS

FIG. 1 is a block diagram of a semiconductor memory device according to one embodiment of this invention;

FIG. 4 is a block diagram showing the construction of an example of a memory system having the semiconductor memory device shown in FIG. 1.

DETAILED DESCRIPTION OF THE PREFERRED EMBODIMENTS

Figure 2:
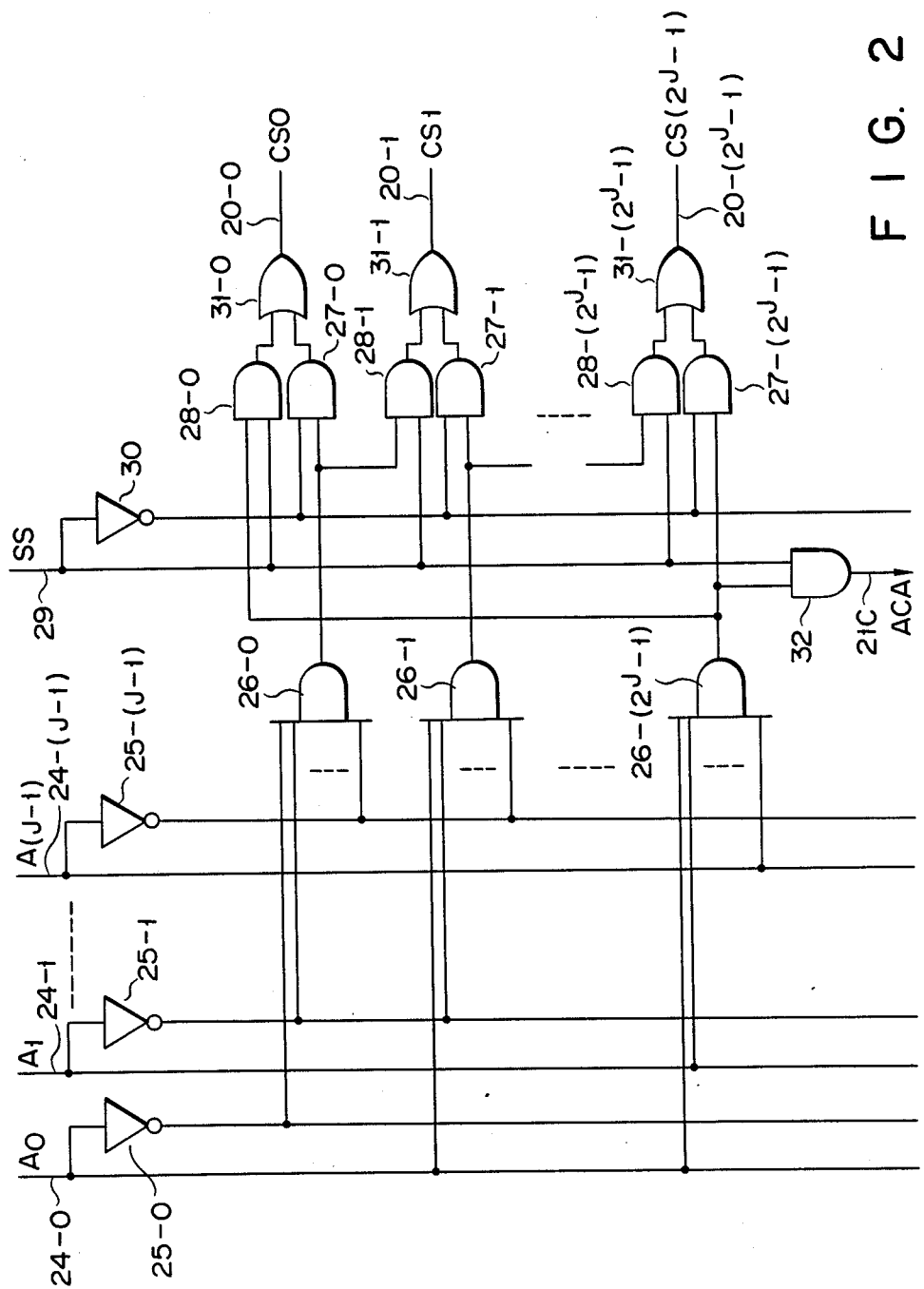
FIG. 2 is a circuit diagram showing the construction of an example of a column decoder used in the semiconductor memory device of FIG. 1.

FIG. 1 shows the construction of an example of a semiconductor memory device according to one embodiment of this invention. Address input signals $A_0$ to $A_{(K-1)}$ applied to input port 11 are supplied to address latch circuit 13 via address input line 12. Row address signals $A_J$ to $A_{(K-1)}$ among address signals $A_0$ to $A_{(K-1)}$ latched in address latch circuit 13 are supplied to row decoder 15 via row address line 14. Further, column address signals $A_0$ to $A_{(J-1)}$ among address signals $A_0$ to $A_{(K-1)}$ latched in address latch circuit 13 are supplied to column decoder and sense amplifier 17 (column decoder 17A and sense amplifier 17B) via column address line 16. Column decoder 17A decodes column address signals $A_0$ to $A_{(J-1)}$ and produces output signals which is used to select two adjacent columns of memory cell array 18. One of the two columns selected by column decoder 17A is selected according to control signal SS supplied to control signal input terminal 19. That is, control signal SS is used to determine whether one is added to the column address. Memory cell array 18 is formed in a matrix form of $2^I$ rows$\times 2^J$ columns (I+J=K). Output signals from column decoder 17A are supplied to memory cell array 18 via bit lines $20-0$ to $20-(2^J-1)$. When the most significant column address of memory cell array 18 is selected by the output signals of column decoder 17A, the least significant column address is selected. In this case, if control signal SS indicates that the column address is incremented by one, the least significant column address is also selected. At this time, column decoder 17A produce address carry signal ACA which in turn is supplied to row decoder 15 via address carry line 21C. Row decoder 15 decodes row address signals $A_J$ to $A_{(K-1)}$ and supplies decoded output signals to select two adjacent rows in memory cell array 18. One of the two adjacent rows selected by row decoder 15 is selected by address carry signal ACA. When address carry signal ACA is generated from column decoder 17A, that one of the two selected adjacent rows which is at a higher bit position is selected. In contrast, when address carry signal ACA is not generated, that one of the two selected adjacent rows which is at a lower bit position is selected. In the case where the most significant row address of memory cell array 18 is selected by means of row decoder 15, the least significant row address is also selected. Under this condition, if address carry signal ACA is generated from row decoder 17A, a row at a lower bit position is selected. In contrast, if address carry signal ACA is not generated, a row at a higher bit position is selected. Output signals from row decoder 15 are supplied to memory cell array 18 via word lines 21-0 to 21-($2^I-1$).

The operation of reading out data from and writing data into a memory cell selected as described above is effected via sense amplifier 17B and input/output buffer 22. That is, at the time of data readout, data is read out from the selected memory cell, amplifier by sense amplifier 17B and output from I/O port 23 via I/O buffer 22. At the time of data write-in, data supplied to I/O port 23 is supplied via I/O buffer 22, column decoder and sense amplifier 17, and bit lines 20-0 to 20-($2^J-1$) and written into memory cell at an address selected by row decoder 15 and column decoder 17A.

FIG. 2 shows an example of the construction of column decoder 17A in the circuit of FIG. 1. Column address signals $A_0, A_1, \ldots$, and $A_{(J-1)}$ are respectively supplied to column address lines 24-0, 24-1, ..., and 24-(J−1). Column address lines 24-0, 24-1, ..., and 24-(J−1) are connected to input terminals of inverters 25-0, 25-1, ..., and 25-(J−1), respectively. Different combinations of column address signals $A_0, A_1, \ldots$, and $A_{(J-1)}$ supplied column address lines 24-0, 24-1, ..., and 24-(J−1) and inverted column address signals $\overline{A_0}, \overline{A_1}, \ldots$, and $\overline{A_{(J-1)}}$ from inverters 25-0, 25-1, ..., and 25-(J−1) are respectively supplied to input terminals of AND gates 26-0, 26-1, ..., and 26-($2^J-1$). An output signal of AND gate 26-0 is supplied to first input terminals of AND gates 27-0 and 28-1. An output signal of AND gate 26-1 is supplied to first input terminals of AND gates 27-1 and 28-2 (not shown). In the same manner, output signals of other AND gates are supplied to first input terminals of latter stage AND gates. For example, an output signal of AND gate 26-($2^J-1$) is supplied to first input terminals of AND gates 27-($2^J-1$) and 28-0. Thus, each of the output signals of AND gates 26-0, 26-1, ..., and 26-($2^J-1$) can be used to select two columns. One of the selected columns is further selected by control signal SS which is supplied to second input terminals of AND gates 28-0, 28-1, ..., and 28-($2^J-1$) via signal line 29. Inverter 30 whose input terminal is connected to signal line 29 supplies inverted control signal $\overline{SS}$ to second input terminals of AND gates 27-0, 27-1, ..., and 27-($2^J-1$). Output signals of paired AND gates 27-0 and 28-0 are supplied to OR gate 31-0 which in turn produces a column select signal CS0 to bit line 20-0. Output signals of paired AND gates 27-1 and 28-1 are supplied to OR gate 31-1 which in turn produces a column select signal CS1 to bit line 20-1. Similarly, output signals of other paired AND gates are supplied to respective OR gates which in turn produce column select signals to corresponding bit lines. For example, output signals of paired AND gates 27-($^J-1$) and 28-($2^J-1$) are supplied to OR gate 31-($2^J-1$) which in turn produces a column select signal CS($2^J-1$) to bit line 20-($2^J-1$).

Signal line 29 is also connected to one input terminal of AND gate 32 which is connected at the other input terminal to an output terminal of AND gate 26-($2^J-1$). AND gate 32 produces address carry signal ACA to address carry signal line 21C.

Inverters 25-0, 25-1, ..., and 25-($2^J-1$) and AND gates 26-0, 26-1, ..., and 26($2^J-1$) function to decode column address signals $A_0, A_1, \ldots$, and $A_{(J-1)}$. Depending on the result of the decoding, one of AND gates 26-0, 26-1, ..., and 26-($2^J-1$) produces an output signal of "1" level and all the other AND gates produce output signals of "0" level. Assume now that an output signal of AND gate 26-0 is at "1" level and output signals of all the other AND gates 26-1 to 26-($2^J-1$) are at "0" level. Then, only column select signal CS0 or CS1 can be set to have "1" level depending on control signal SS. In this case, if control signal SS is at "0" level, only column select signal CS0 is set at "1" level and all the other column select signals CS1 to CS($2^J-1$) are set at "0" level. In contrast, if control signal SS is at "1" level, only column select signal CS1 is set at "1" level and all the other column select signals are set at "0" level. In the case where an output signal from one of AND gates 26-1 to 26-($2^J-2$) (not shown) is at "1" level, a corresponding one of column select signals CS2 to CS($2^J-1$) can be set at "1" level according to control signal SS in the same manner as described above. For example, when an output signal of AND gate 26-($2^J-1$) is at "1" level and output signals from AND gates 26-0 to 26-($2^J-2$) are at "0" level, column select signal CS($2^J-1$) or CS0 can be set to have "1" level depending on control signal SS. If control signal SS is at "0" level, an output signal of AND gate 27($2^J-1$) is set to "1" level, causing an output signal of OR gate 31-($2^J-1$) or column select signal CS($2^J-1$) to be set to "1" level. At this time, all the other column select signals CS0 to CS($2^J-2$) are set at "0" level. In contrast, if control signal SS is at "1" level, an output signal of AND gate 28-0 is set to "1" level, causing an output signal of OR gate 31-0 or column select signal CS0 to be set to "1" level. At this time, all the other column select signals CS1 to CS($2^J-1$) are at "0" level.

When an output signal of AND gate 26-($2^J-1$) is at "1" level and control signal SS is set at "1" level, address carry signal ACA from AND gate 32 is set to "1" level. In other cases, address carry signal ACA is set to "0" level.

Column select signals CS0, CS1, ..., and CS($2^J-1$) supplied from OR gates 31-0, 31-1, ..., and 31-($2^J-1$) are represented by the following equations.

$$CS0 = A_0 \cdot A_1 \cdot \ldots \cdot A_{(J-1)} \cdot SS + \overline{A_0} \cdot \overline{A_1} \cdot \ldots \cdot \overline{A_{(J-1)}} \cdot \overline{SS}$$

$$CS1 = \overline{A_0} \cdot \overline{A_1} \cdot \ldots \cdot \overline{A_{(J-1)}} \cdot SS + A_0 \cdot \overline{A_1} \cdot \ldots \cdot \overline{A_{(J-1)}} \cdot \overline{SS}$$

$$CS2 = A_0 \cdot \overline{A_1} \cdot \ldots \cdot \overline{A_{(J-1)}} \cdot SS + \overline{A_0} \cdot A_1 \cdot \ldots \cdot \overline{A_{(J-1)}} \cdot \overline{SS}$$

.
.
.

$$CS(2^J-1) = \overline{A_0} \cdot A_1 \cdot \ldots \cdot A_{(J-1)} \cdot SS + A_0 \cdot A_1 \ldots \cdot A_{(J-1)} \cdot \overline{SS}$$

Further, address carry signal ACA is obtained by the following equation.

$$ACA = A_0 \cdot A_1 \cdot \ldots \cdot A_{(J-1)} \cdot SS$$

Figure 3:
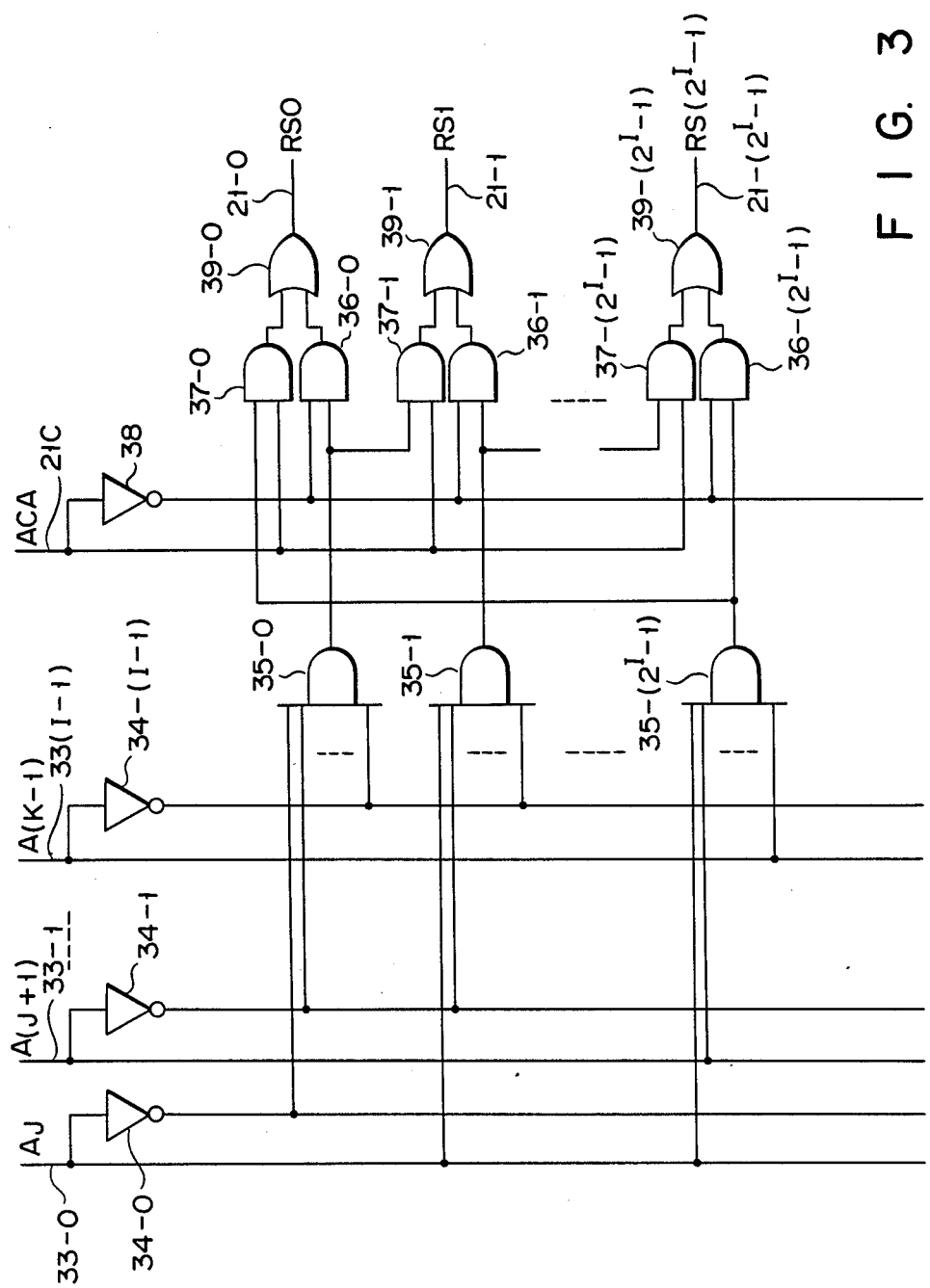
FIG. 3 is circuit diagram showing the construction of an example of a row decoder used in the semiconductor memory device of FIG. 1.

FIG. 3 shows the construction of row decoder 15 in the circuit of FIG. 1. The construction of row decoder 15 is basically the same as that of column decoder 17A shown in FIG. 2. In the FIG. 3 circuit, row address signals $A_J$, $A_{(J+1)}$, ..., and $A_{(K-1)}$ are respectively supplied to row address lines 33-0, 33-1, ..., and 33-(I−1) to which input terminals of inverters 34-0, 34-1, ..., and 34-(I−1) are connected. Combinations of row address signals $A_J$, $A_{(J+1)}$, ..., and $A_{(K-1)}$ supplied to row address lines 33-0, 33-1, ..., and 33-(I−1) and inverted row address signals $\overline{A_J}$, $\overline{A_{(J+1)}}$, ..., and $\overline{A_{(K-1)}}$ supplied from inverters 34-0, 34-1, ..., and 34-(I−1) are respectively supplied to AND gates 35-0, 35-1, ..., and 35-($2^I$−1). AND gate 35-0 supplies an output signal to first input terminals of AND gates 36-0 and 37-1, and AND gate 35-1 supplies an output signal to first input terminals of AND gates 36-1 and 37-2 (not shown). In the same manner, each of the other AND gates supplies output signals to the latter stage two AND gates. For example, AND gate 35-($2^I$−1) supplies an output signal to first input terminals of AND gates 36-($2^I$−1) and 37-0. Thus, each of the output signals of AND gates 35-0, 35-1, ..., and 35-($2^I$−1) can be used to select two rows. One of the selected rows is further selected by address carry signal ACA which is supplied from row decoder 17A to second input terminals of AND gates 37-0, 37-1, ..., and 37-($2^I$−1) via address carry signal line 21C. Inverter 38 whose input terminal is connected to address carry signal line 21C supplies inverted address carry signal $\overline{ACA}$ to second input terminals of AND gates 36-0, 36-1, ..., and 36-($2^I$−1). Output signals of paired AND gates 36-0 and 37-0 are supplied to OR gate 39-0 which in turn produces a row select signal RS0 to word line 21-0. Output signals of paired AND gates 36-1 and 37-1 are supplied to OR gate 39-1 which in turn produces a row select signal RS1 to word line 21-1. Similarly, output signals of other paired AND gates are supplied to respective OR gates which is turn produce row select signals to corresponding word lines. For example, output signals of paired AND gates 36-($2^I$−1) and 37-($2^I$−1) are supplied to OR gate 39-($2^I$−1) which in turn produces a row select signal RS($2^I$−1) to word line 21-($2^I$−1).

The operation of row decoder 15 in the FIG. 3 circuit is basically the same as that of column decoder 17A in the FIG. 2 circuit. They are different from each other only in that control signal SS is used to select one of the selected two columns in column decoder 17A and address carry signal ACA is used to select one of the selected two rows in row decoder 15.

Row select signals RS0, RS1, ..., and RS($2^I$−1) from OR gates 39-0, 39-1, ..., and 39-($2^I$−1) are represented by the following equations.

$RS0 =$ $A_J \cdot A_{(J+1)} \cdot \ldots \cdot A_{(K-1)} \cdot ACA + \overline{A_J} \cdot \overline{A_{(J+1)}} \cdot \ldots \cdot \overline{A_{(K-1)}} \cdot \overline{ACA}$ $RS1 =$ $\overline{A_J} \cdot \overline{A_{(J+1)}} \cdot \ldots \cdot \overline{A_{(K-1)}} \cdot ACA + A_J \cdot \overline{A_{(J+1)}} \cdot \ldots \cdot \overline{A_{(K-1)}} \cdot \overline{ACA}$

.
.
.

$RS(2^I - 1) =$ $\overline{A_J} \cdot A_{(J+1)} \cdot \ldots \cdot A_{(K-1)} \cdot ACA + A_J \cdot A_{(J+1)} \cdot \ldots \cdot A_{(K-1)} \cdot \overline{ACA}$ With column decoder 17A of FIG. 2 and row decoder 15 of FIG. 3, the operation of access to a memory cell can be effected as follows. That is, an address is designated in memory cell array 18 by row address signals $A_J$, $A_{(J+1)}$, ..., and $A_{(K-1)}$ and column address signals $A_0$, $A_1$, ..., and $A_{(J-1)}$. In this case, if control signal SS is at "1" level, a memory cell at an address obtained by adding one to the designated address is accessed, and if control signal SS is at "0" level, a memory cell at the designated address is accessed. That is, the same memory cell can be selected by designating a corresponding address and setting control signal SS to "1" level or by designating an address equal to the sum of the corresponding address and one and setting control signal SS to "0" level. In other words, one of two adjacent memory cells can be selectively accessed according to control signal SS without changing the designated address.

FIG. 4 shows the construction of a memory system using a semiconductor memory device of FIG. 1. Unit of data (word) to be processed by a CPU for the memory system is $2^m \times n$ bits, and each address is assigned for every n bits in this memory system. Memory banks 40-0, 40-1, ..., and 40-($2^m$−1) are each formed have the same construction as that of the semiconductor memory device of FIG. 1, and each address of memory banks 40-0, 40-1, ..., and 40-($2^m$−1) is assigned for every n bits. Memory banks 40-0, 40-1, ..., and 40-($2^m$−1) are connected to receive address signals SAm to SA(m+k−1) of upper k bits via address bus 41 from a computer system. The computer system supplies address signals SA0 to SA(m−1) of lower m bits to decoder 43 through address bus 42. Decoder 43 produces, in response to address signals SA0 to SA(m−1), decode output signals SS0 to SS($2^m$−1) which correspond to control signal SS in the FIG. 1 circuit. Decode output signals SS0 to SS($2^m$−1) are supplied to memory banks 40-0, 40-1, ..., and 40-($2^m$−1) via signal lines 44-0 to 44-($2^m$−1) to determine whether or not one is added to a designated address for memory banks 40-0, 40-1, ..., and 40-($2^m$−1). Data $D_0$ to D($2^m$−1)·n are read out from address locations of memory banks 40-0, 40-1, ..., and 40-($2^m$−1) selected by address signals SA0 to SA(m+k−1) and supplied via data lines 45-0 to 45-($2^m$−1).

For example, decoder 43 produces, in response to address signals SA0 to SA(m−1), decode output signals (control signpost) SS0 to SS($2^m$−1 (as shown in the following table.

| Address Signals | Decode Signals SS0 to SS($2^m$-1) | | | | | |
|---|---|---|---|---|---|---|
| SA0 to SA(m-1) | SS0 | SS1 | SS2 | ... | SS($2^m$-2) | SS($2^2$-1) |
| 0 | 0 | 0 | 0 | ... | 0 | 0 |
| 1 | 1 | 0 | 0 | ... | 0 | 0 |
| 2 | 1 | 1 | 0 | ... | 0 | 0 |
| 3 | 1 | 1 | 1 | ... | 0 | 0 |
| . | . | . | . | | . | . |
| . | . | . | . | | . | . |
| . | . | . | . | | . | . |
| $2^m$-1 | 1 | 1 | 1 | ... | 1 | 0 |

Assume now that address signals SA0 to SA(m−1) represent "0". Then, decode output signals SS0 to SS($2^m$−1) are all set at "0". Therefore, a memory cell in each of memory banks 40-0 to 40-($2^m$−1) is accessed by an address which is designated by address signals SAm to SA(m+k−1). That is, one is not added to the designated address.

In the case where address signals SA0 to SA(m−1) represent "1", decode signal SS0 is set at "1" level and decode signals SS1 to SS($2^m$−1) are set at "0" level. Therefore, an address which is equal to the sum of one and a designated address is used for memory bank 40-0 and a designated address for each of memory banks 40-1 to 40-($2^m$−1) is used as it is.

Similarly, in the case where address signals SA0 to SA(m−1) represent "2", decode signals SS0 and SS1 are set at "1" level and decode signals SS2 to SS($2^m$−1) are set at "0" level. Therefore, one is added to an address designated in each of memory banks 40-0 and 40-1 and an address designated in each of memory banks 40-2 to 40-($2^m$−1) is not changed.

In other cases, the same operations are effected as described above. For example, in the case where address signals SA0 to SA(m−1) represent "$2^m$−1", decode signals SS0 to SS($2^m$−2) are all set at "1" level and decode signal SS($2^m$−1) is set at "0" level. Therefore, one is added to an address designated by address signals SAm to SA(m+k−1) in each of memory banks 40-0 to 40-($2^m$−2) and an address designated in memory bank 40-($2^m$−1) is not changed is construction, one word starting at a desired address can be read out from memory banks 40-0 to 40-($2^m$−1) by setting the levels of decode output signals SS0 to SS($2^m$−1) according to address signals SA0 to SA(m−1) as shown in the table. Further, the operation of adding one to a designated address for the memory bank can be effected by use of decode signals (control signals) SS0 to SS($2^m$−1). Therefore, it is not necessary to use an address incrementer and an address selector. Thus, any word starting at a desired address can be read out by one access operation without making the access time long.

What is claimed is:

1. A semiconductor memory device comprising:
    a memory cell array;
    column decoding means for selecting, in response to a column address signal, one of a plurality of memory cell columns of said memory cell array;
    a control signal input terminal connected to receive a control signal determining whether or not one is added to the address designating the memory cell column selected by said column decoding means;
    first selection means for selecting, in response to the control signal, one of the column address specifying the memory cell column selected by said column decoding means, and a different address, obtained by adding one to the selected column address, or one of the most and least significant column addresses, when the selected column address is the most significant column address;
    address carry signal generating means for generating an address carry signal when the most significant address is selected by said column decoding means and the control signal is set to indicate that one is added to the column address;
    row address decoding means for selecting a memory cell row in said memory cell array, in response to a row address signal; and
    second selection means for selecting, in response to an address carry signal from said address carry signal generating means, one of the row address designating the memory cell row selected by said row decoding means, and a different address, obtained by adding one to the selected row address, or one of the most and least significant row addresses, when the selected row address is the most significant row address.

2. A semiconductor memory device according to claim 1, wherein the column address signal includes a plurality of column address signal components, and said column decoding means comprises a group of AND gates which are connected to receive different combinations of the column address signal components and inverted column address signal components thereof.

3. A semiconductor memory device according to claim 1, wherein said column decoding means includes first to Xth output terminals, and said first selection means includes a first group of first to Xth AND gates which are connected to respectively receive first to Xth output signals of said column decoding means at one input terminal, and an inverted signal of the control signal at the other input terminal, a second group of first to Xth AND gates which are connected to respectively receive Xth and first to (X−1)th output signals of said column decoding means at one input terminal, and the control signal at the other input terminal, and a group of first to Xth OR gates which are each connected to receive a corresponding one of output signals from said first group of first to Xth AND gates, and a corresponding one of output signals from said second group of first to Xth AND gates, and produce an output signal designating a column address of said memory cell array.

4. A semiconductor memory device according to claim 1, wherein said address carry signal generating means includes an AND gate connected to receive the most significant column address signal from said column decoding means at one input terminal, and the control signal at the other input terminal.

5. A semiconductor memory device according to claim 1, wherein said row address decoding means includes a group of AND gates connected to receive combinations of the row address signals and inverted row address signals thereof.

6. A semiconductor memory device according to claim 1, wherein said row decoding means includes first to Yth output terminals, and said second selection means includes a first group of first to Yth AND gates which are connected to respectively receive first to Yth output signals of said row decoding means at one input terminal, and an inverted signal of the address carry signal at the other input terminal, a second group of first to Yth AND gates which are connected to respectively receive Yth, and first to (Y−1)th output signals of said row decoding means at one input terminal, and the address carry signal at the other input terminal, and a group of first to Yth OR gates which are each connected to receive a corresponding one of output signals from said first group of first to Yth AND gates, and a corresponding one of output signals from said second group of first to Yth AND gates, and produce an output signal designating a row address of said memory cell array.

7. A semiconductor memory device comprising:
    a memory cell array;
    a control signal input terminal connected to receive a control signal determining whether or not one is added to an address designating a memory cell in said memory cell array;
    column decoding means for, on the one hand, selecting two adjacent columns in said memory cell array, in response to a column address signal, then selecting one of the two adjacent columns at the higher or lower position, depending on whether the control signal indicates that one is added to the address or that one is not added thereto, and supplying the selected address to said memory cell array, and, on the other hand, selecting the most and least significant column addresses when the column address is the most significant address, then selecting one of the least significant column address and most significant column address, depending on whether the control signal indicates that one is added to the address or that one is not added thereto, and supplying an address carry signal;

row decoding means for selecting two adjacent rows in said memory cell array, in response to an address carry signal, then selecting one of the two adjacent rows at the higher or lower position, depending on whether or not the address carry signal is generated, and supplying the selected address to said memory cell array, and selecting the most and least significant column addresses when the row address is the most significant row address, then selecting one of the least significant row address and most significant row address, depending on whether or not the address carry signal is generated.

8. A semiconductor memory device according to claim 7, wherein said column decoding means comprises a first group of first to Xth AND gates which are connected to receive different combinations of column address signal components and inverted column address signal components thereof; a second group of first to Xth AND gates which are connected to respectively receive output signals of the first to Xth AND gates of said first group at one input terminal, and an inverted signal of the control signal at the other input terminal; a third group of first to Xth AND gates which are connected to respectively receive Xth and first to (X−1)th output signals of said first group of first to Xth AND gates at one input terminal, and the control signal at the other input terminal; and a group of first to Xth OR gates which are each connected to receive a corresponding one of output signals from said second group of first to Xth AND gates and a corresponding one of output signals from said third group of first to Xth AND gates; and an AND gate connected to receive the most significant column address signal from said column decoding means at one input terminal, and the control signal at the other input terminal, a column address signal, designating a column address of said memory cell array, being derived from said group of first to Xth OR gates, and an address carry signal being derived from said AND gate.

9. A semiconductor memory device according to claim 7, wherein said row decoding means comprises a first group of first to Yth AND gates which are connected to receive different combinations of row address signal components and inverted row address signal components thereof; a second group of first to Yth AND gates which are connected to respectively receive output signals of the first to Yth AND gates of said first group at one input terminal, and an inverted signal of the control signal at the other input terminal; a third group of first to Yth AND gates which are connected to respectively receive Yth and first to (Y−1)th output signals of said first group of first to Yth AND gates at one input terminal, and the control signal at the other input terminal; and a group of first to Yth OR gates which are each connected to receive a corresponding one of output signals from said second group of first to Yth AND gates and a corresponding one of output signals from said third group of first to Yth AND gates; a row address signal, designating a row address of said memory cell array, being derived from said group of first to Yth OR gates.

10. A semiconductor memory device comprising:
a first address bus;
a plurality of memory banks connected to receive first address signals supplied via said first address bus;
a second address bus; and
decoding means connected to receive second address signals supplied via said second address bus, and to supply to said memory banks control signals indicating that one is added to an address in said respective memory banks;
wherein each of said memory banks comprises:
a memory cell array;
a column decoder for selecting one of a plurality of memory cell columns of said memory cell array, in response to an address signal;
first selection means for selecting, in response to a control signal, one of the column address selected by said column decoder, and a different column address, obtained by adding one to the selected column address, or one of the most and least significant column addresses, when the selected column address is the most significant column address;
address carry signal generating means for generating an address carry signal when the most significant address is selected by said column decoder and the control signal is set to indicate that one is added to the column address;
a row decoder for selecting a memory cell row in said memory cell array, in response to a row address signal; and
second selection means for selecting, in response to an address carry signal from said address carry signal generating means, one of the row address selected by said row decoder, and a different address, obtained by adding one to the selected row address, or one of the most and least significant row addresses, when the selected row address is the most significant row address.

11. A semiconductor memory device according to claim 10, wherein said column decoder includes a group of AND gates connected to receive column address signal components and inverted column address signal components thereof.

12. A semiconductor memory device according to claim 10, wherein said column decoder includes first to Xth output terminals, and said first selection means includes a first group of first to Xth AND gates which are connected to respectively receive first to Xth output signals of said column decoder at one input terminal, and an inverted signal of the control signal at the other input terminal, a second group of first to Xth AND gates which are connected to respectively receive Xth and first to (X−1)th output signals of said column decoder at one input terminal, and the control signal at the other input terminal, and a group of first to Xth OR gates which are each connected to receive a corresponding one of output signals from said first group of first to Xth AND gates and a corresponding one of output signals from said second group of first to Xth AND gates, and produce an output signal designating a column address of said memory cell array.

13. A semiconductor memory device according to claim 10 wherein said address carry signal generating means includes an AND gate connected to receive the most significant column address signal from said column decoder at one input terminal, and the control signal at the other input terminal.

14. A semiconductor memory device according to claim 10, wherein said row decoder includes a group of AND gates connected to receive combinations of the row address signals and inverted row address signals thereof.

15. A semiconductor memory device according to claim 10, wherein said row decoder includes first to Yth output terminals, and said second selection means includes first group of first to Yth AND gates which are connected to respectively receive first to Yth output signals of said row decoder at one input terminal, and an inverted signal of the address carry signal at the other input terminal, a second group of first to Yth AND gates which are connected to respectively receive Yth and first to (Y−1)th output signals of said row decoder at one input terminal, and the address carry signal at the other input terminal, and a group of first to Yth OR gates which are each connected to receive a corresponding one of output signals from said first group of first to Yth AND gates and a corresponding one of output signals from said second group of first to Yth AND gates, and produce an output signal designating a row address of said memory cell array.

* * * * *